(12) United States Patent
Estacio et al.

(10) Patent No.: US 6,617,655 B1
(45) Date of Patent: Sep. 9, 2003

(54) MOSFET DEVICE WITH MULTIPLE GATE CONTACTS OFFSET FROM GATE CONTACT AREA AND OVER SOURCE AREA

(75) Inventors: Maria Cristina B. Estacio, Cebu (PH); Margie Tumulak, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/117,940

(22) Filed: Apr. 5, 2002

(51) Int. Cl.[7] ............................................. H01L 23/485
(52) U.S. Cl. ..................... 257/401; 257/737; 257/738; 257/759; 257/762; 257/766
(58) Field of Search .................. 257/401, 737, 257/738, 758, 759, 762, 763, 764, 766; 438/612, 613, 614

(56) References Cited

U.S. PATENT DOCUMENTS

| | | | | |
|---|---|---|---|---|
| 5,486,715 A | * | 1/1996 | Zommer | 257/341 |
| 5,686,750 A | * | 11/1997 | Takahashi | 257/328 |
| 5,719,448 A | * | 2/1998 | Ichikawa | 257/781 |
| 6,294,403 B1 | * | 9/2001 | Joshi | 438/106 |
| 6,384,486 B2 | * | 5/2002 | Zuniga et al. | 257/781 |
| 6,417,087 B1 | * | 7/2002 | Chittipeddi et al. | 438/612 |
| 2001/0029063 A1 | * | 10/2001 | Fukuda | 438/111 |

* cited by examiner

Primary Examiner—Carl Whitehead, Jr.
Assistant Examiner—Stephen W. Smoot
(74) Attorney, Agent, or Firm—Thomas R. FitzGerald, Esq.

(57) ABSTRACT

Careful repositioning of MOSFET gate contacts and increasing of their number makes MOSFET gate contacts more durable and reliable without requiring changes in either the leadframe design or the assembly process. Extension of the under-bump metal laterally from the gate contact with the gate pad metallization out to two or more gate pads not overlying the gate pad metallization minimizes the risk of delamination of the metallization due to thermal and mechanical stresses in assembly and operation. Use of more than one gate pad further reduces such failure risks. Positioning the gate pads sufficiently close to the original gate contact permits use of the same leadframe design and assembly process as would be used for a single gate pad placed directly over the gate contact. The result is a reliable, durable MOSFET gate contact compatible with current assembly methods.

40 Claims, 17 Drawing Sheets

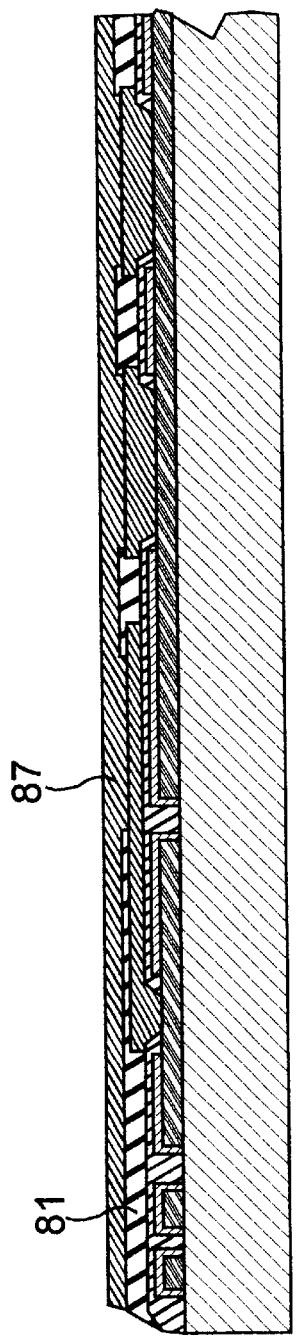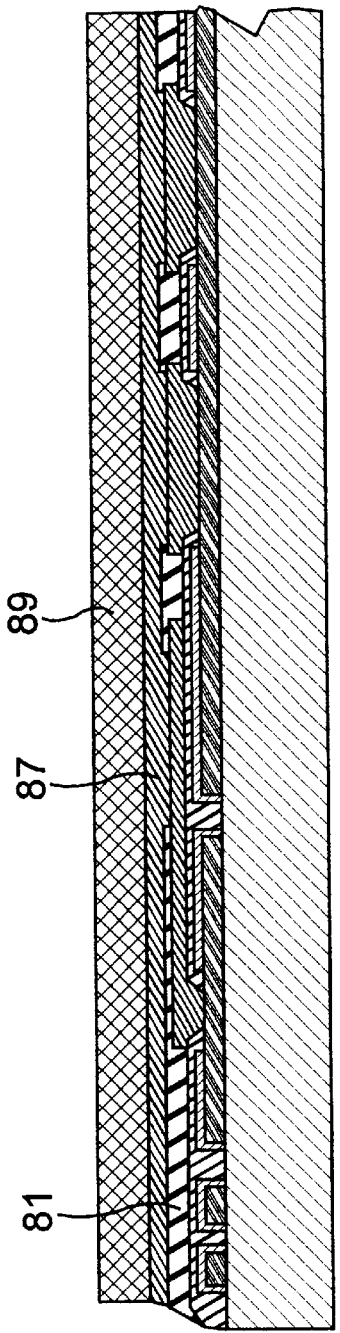

Legend for Figs. 3-23

MOSFET DEVICE WITH MULTIPLE GATE CONTACTS OFFSET FROM GATE CONTACT AREA AND OVER SOURCE AREA

FIELD OF THE INVENTION

This invention relates to semiconductor fabrication, and more specifically to MOSFET contact fabrication.

DEFINITIONS

BCB: benzocyclobutene, an insulating polymer widely used as a photosensitive patterning material and insulator.

RDSon: the on-state drain-to-source resistance in a MOSFET.

UBM: under-bump metal, the conductive metal used to connect a source or gate contact to an external circuit via a surface solder bump.

DISCUSSION OF PRIOR ART

MOSFET die layouts are designed to maximize the source contact area for optimum RDSon performance. This approach leaves just enough area for the gate pad to establish one wirebonding connection or bump connection. With the increasing trend toward wireless packaging via wafer bumping and flipchip technologies, a single gate bump contact serves the purpose. A disadvantage of single gate bump contact designs is that mechanical and thermal stress experienced by this single gate bump contact can cause disconnection. Inherent in multilayer metal stack technology, as commonly used in MOSFET contact areas, is the frequent problem of delamination of such metallization from its underlying dielectric layer due to differences between the coefficients of thermal expansion of the metallization and the dielectric when the stack is subjected to thermal stress. Such delamination of the metallization renders the parent device inoperable and unusable. Increasing the gate contact area in an attempt to guarantee robustness does not help, since the resulting contact still constitutes only a single connection. Producing more gate contacts through die redesign is a more-costly option, and consumes a larger portion of the source area.

SUMMARY

By carefully repositioning MOSFET gate pads and increasing their number, the invention makes MOSFET gate connections more durable and reliable without requiring changes in either the leadframe design or the assembly process. The invention extends under-bump metal laterally from the gate pad metallization contact out to two or more gate pads not overlying the gate metallization. This approach minimizes the risk of delamination of the metallization due to thermal and mechanical stresses in assembly and operation. The invention's use of more than one gate pad further reduces such failure risks. The gate pads are positioned sufficiently close to the original gate contact to permit use of the same leadframe design and assembly process as would be used for a single gate pad placed directly over the gate contact. The result is a reliable, durable MOSFET gate contact compatible with current assembly methods.

DESCRIPTION OF DRAWINGS

FIGS. 3 through 20 show the steps in the fabrication of multiple gate contacts using solder bumps.

Figure 23:
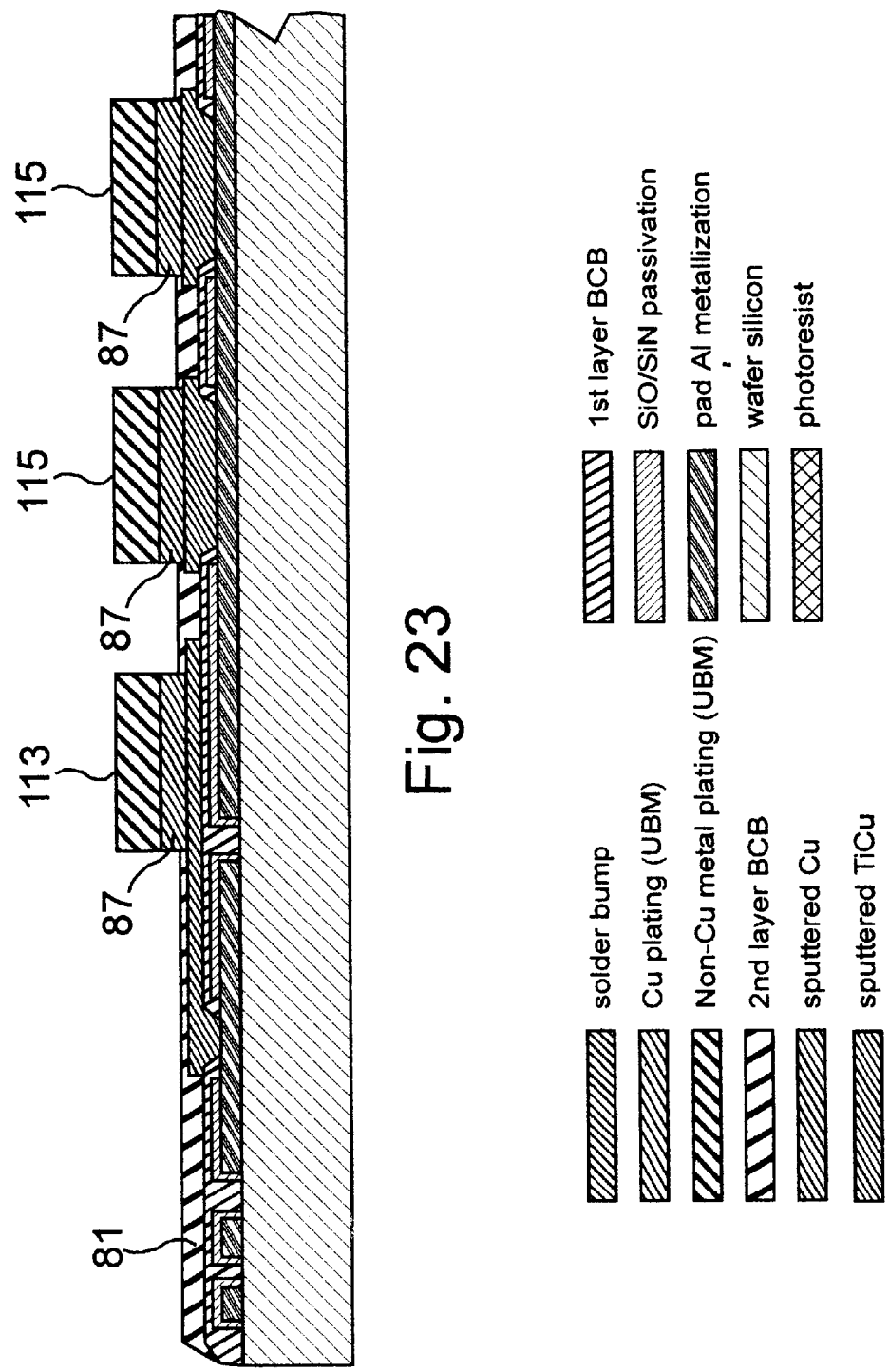

A legend for FIGS. 1, 1a, and 3–23 is shown on the drawing sheet with FIG. 23. The legend shows conductive layers with diagonal lines upward from left to right, and insulating layers with diagonal lines downward from left to right.

DETAILED DESCRIPTION OF INVENTION

This invention details a practical approach of creating more gate contacts on a MOSFET die without introducing alteration in either the internal die layout or the subsequent assembly process. The invention's approach resembles the redistribution or routing techniques used in ball grid array (BGA) chips, in which the contact opening of a pad is relocated to another position in substrate layout design. The present invention creates dual or multiple gate pads for a single gate: contact. For bumped gate pads, the stress is therefore distributed among the pads, so that the stress experienced by one connection is equal to the total stress divided by the number of connections (i.e., for a dual connection, stress is divided by 2; for a triple connection, stress is divided by 3). The strength of the entire gate connection is multiplied twice if it uses a dual gate contact, or three times if it uses a-triple gate contact. This approach sharply reduces the mechanical stress introduced during assembly processing, and avoids multi-metal stacking on top of the gate metallization.

Figure 1:
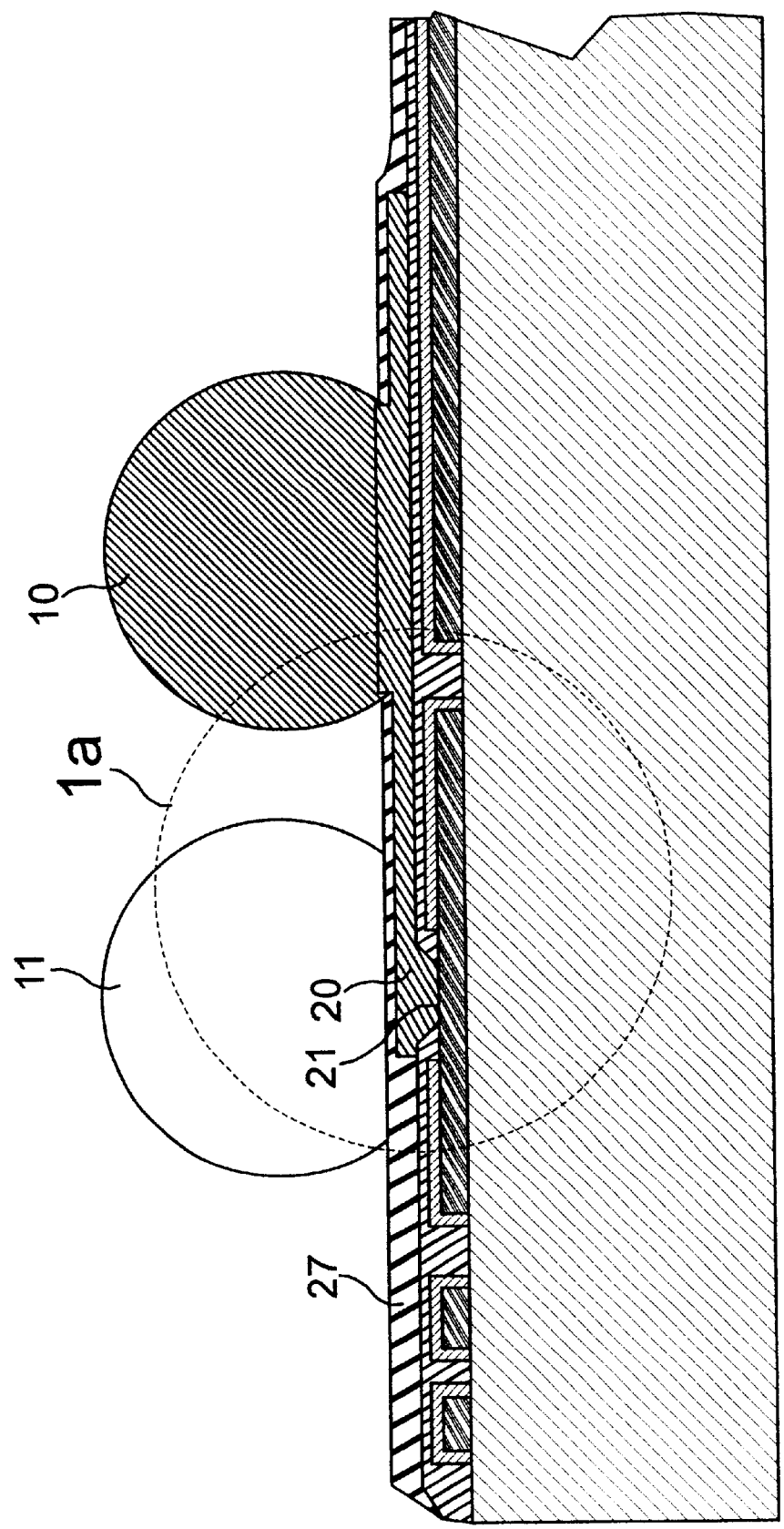
FIG. 1 shows a schematic layout of the multiple gate pad, with a foreground cross-section.
Figure 1A:
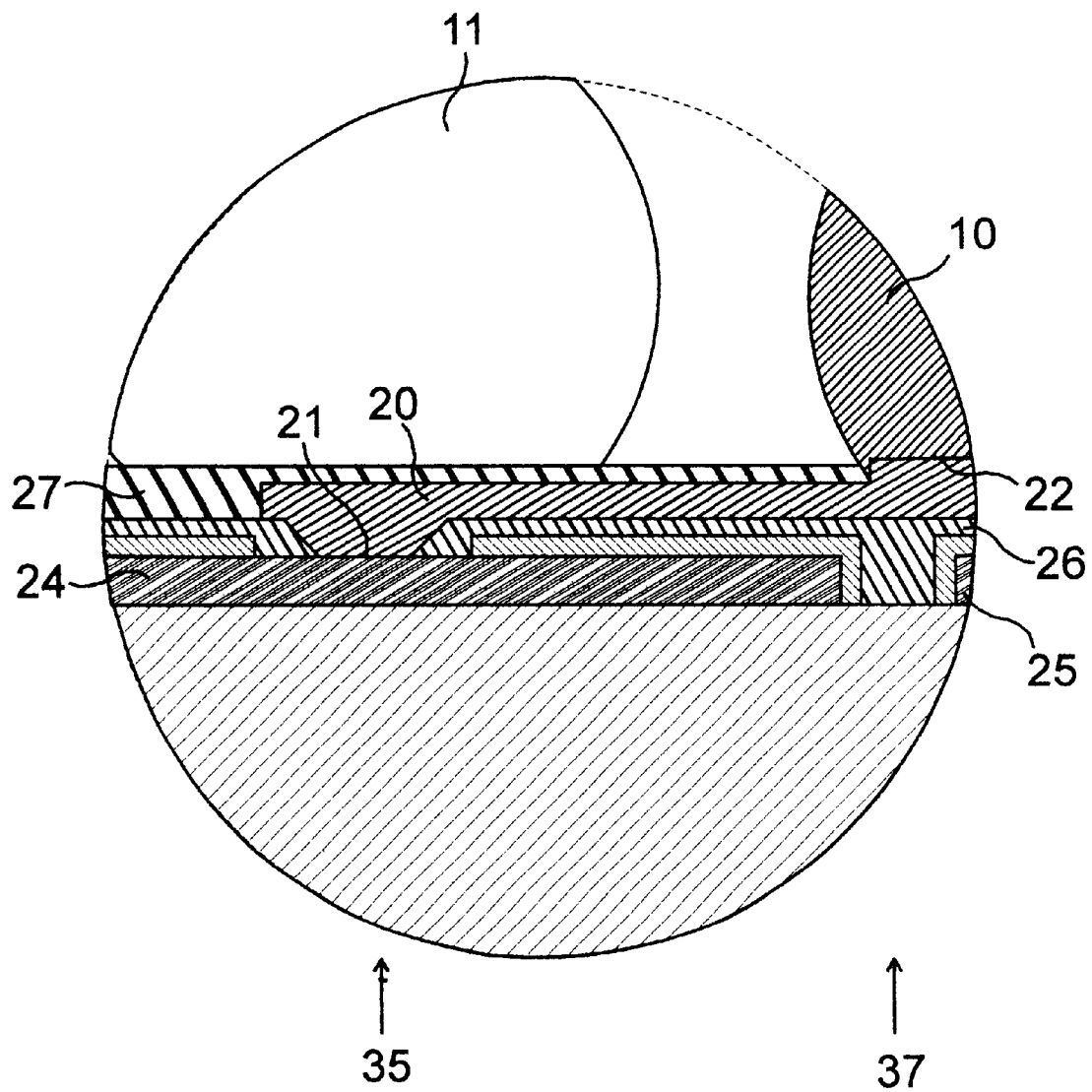
FIG. 1a shows a detail of FIG. 1.

The invention eliminates the multilayer metal from atop the gate contact by laterally offsetting the gate bump contact and multi-metal layers from the gate contact region. See FIG. 1, showing a first solder bump 10 in cross section, and a second solder bump 11 in the background, with under bump metal (UBM) 20 extending from gate contact 21 to solder bump 10. FIG. 1a shows the details of the gate bump contact offset. Under bump metal (UBM) 20 contacts gate pad metallization 24 at gate contact 21 at one horizontal location 35, and runs laterally over a first layer BCB 26 of insulating material to a second horizontal location 37. UBM 20 at location 37 is built up into a bump termination 22, which emerges through a second layer BCB 27 and rests atop first layer BCB 26 and source metallization 25. There is no bump termination above gate pad metallization 24. A second bump termination is likewise created for second solder bump 11.

On top of gate metallization 24 there is no actual stacking of the under bump metal and no UBM with a solder bump. For this reason the relocation of the bump terminations on top of a BCB layer over the source area minimizes the stress on the gate pad. With the UBM or UBM with solder bump seated on top of a polymer such as BCB 26, torsional stress or thermal stress introduced during assembly processing or board mounting are better tolerated and withstood, sharply reducing the overall probability of connection failure.

Figure 2:
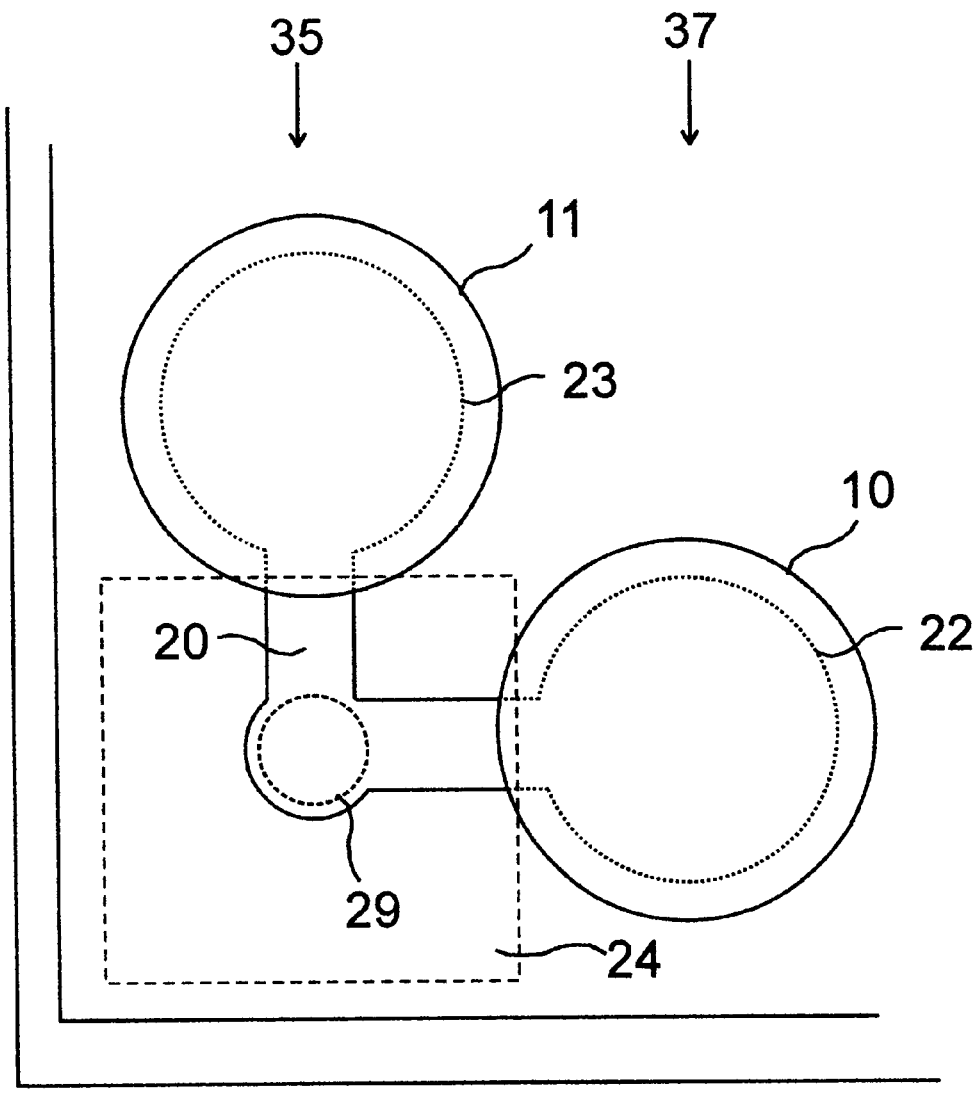
FIG. 2 shows a plan view of the gate pad of FIG. 1.
Figure 3:
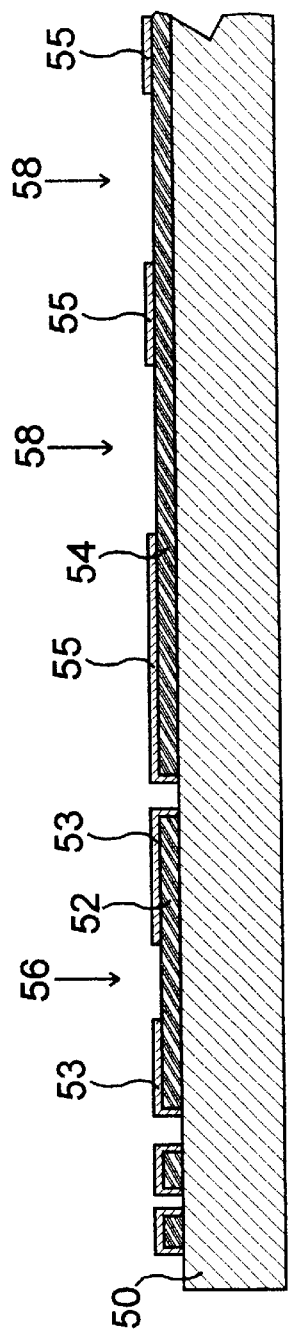

For a plan view of the gate contact region and the solder bumps, see FIG. 2. Gate contact metallization region 24 surrounds passivation opening 29, where UBM 20 makes contact. UBM 20 extends to bump terminations 22, 23 protruding through the second layer BCB. Gate solder bumps 10, 11 are fabricated above bump termination 22, 23 respectively. FIG. 2 shows that the invention positions two gate bump terminations 22, 23 in areas offset from gate contact metallization area 24. This positioning minimizes the thermal and mechanical stresses that threaten the reliability and integrity of electrical connection. Supplying more than one gate bump further enhances the invention's connection reliability and integrity.

Figure 4:
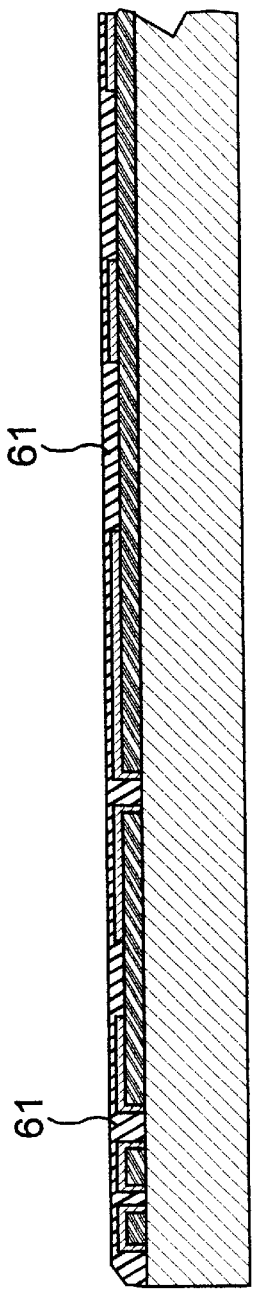
Figure 5:
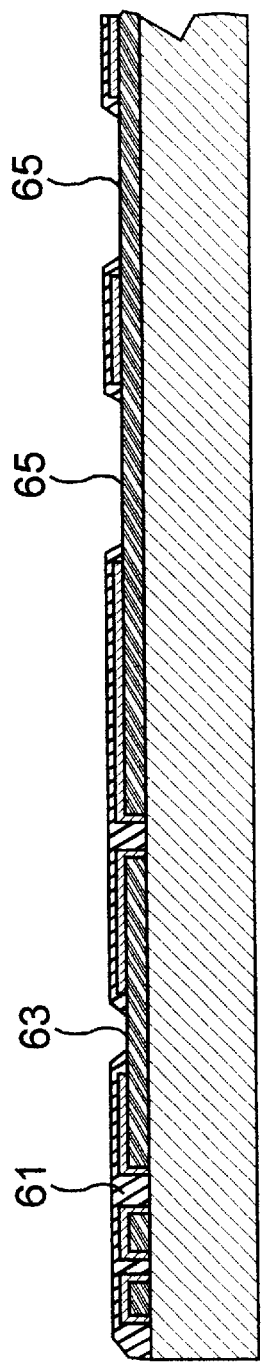
Figure 6:
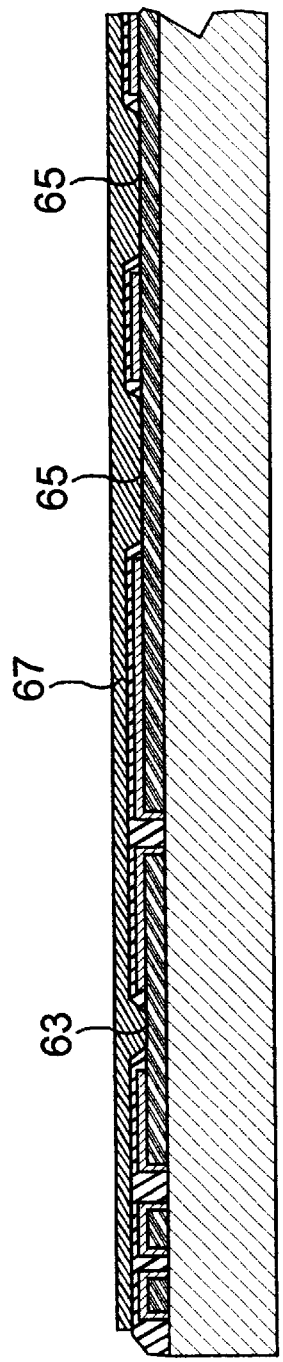
Figure 7:
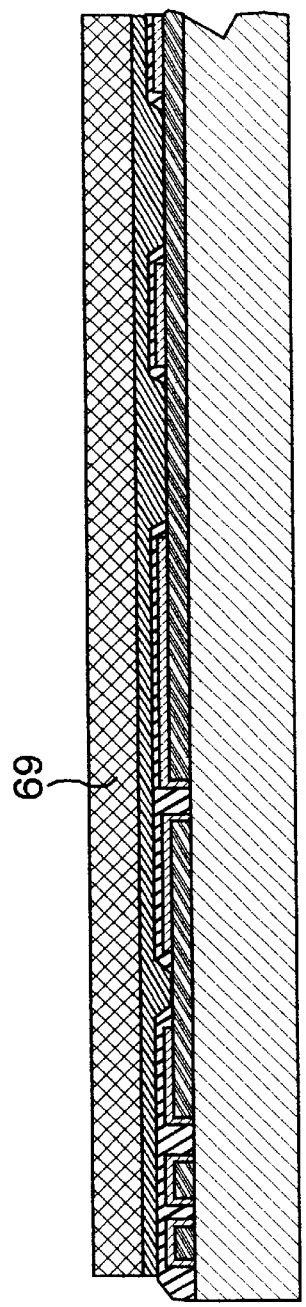
Figure 8:
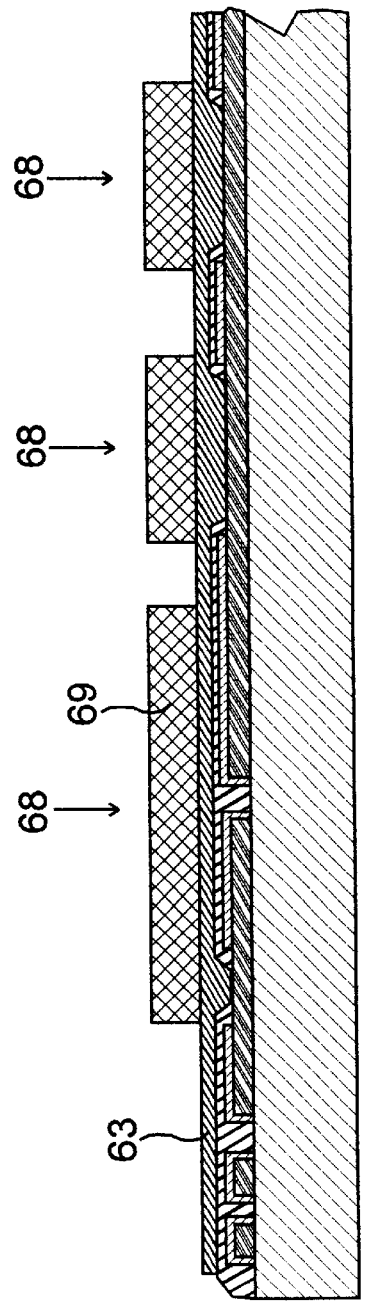
Figure 9:
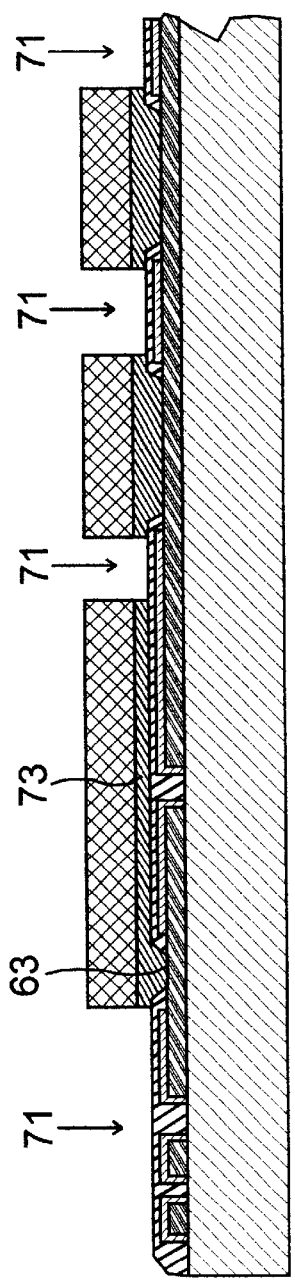
Figure 10:
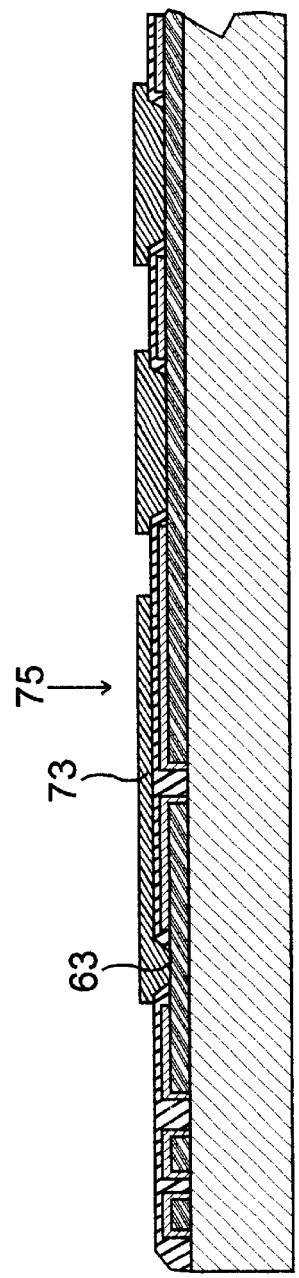
Figure 11:
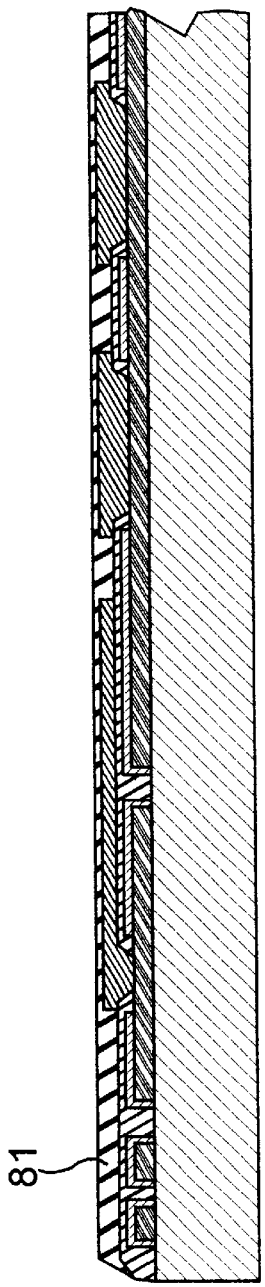
Figure 12:
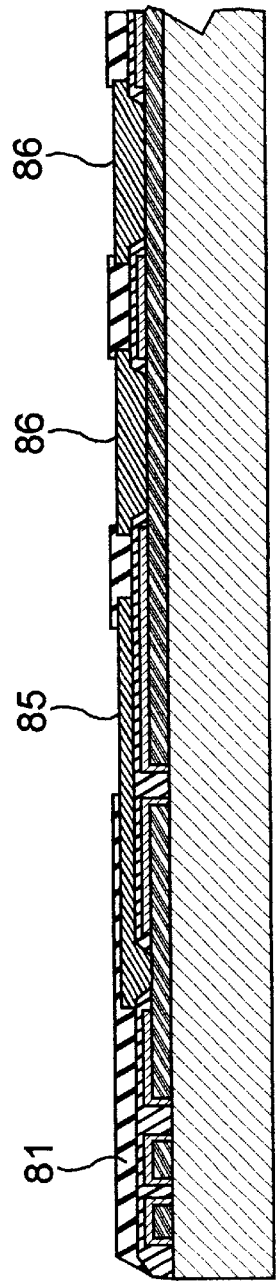
Figure 15:
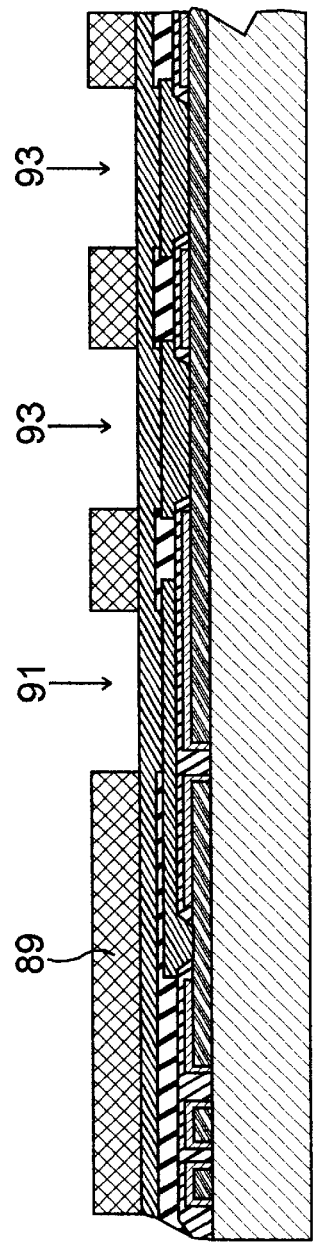
Figure 16:
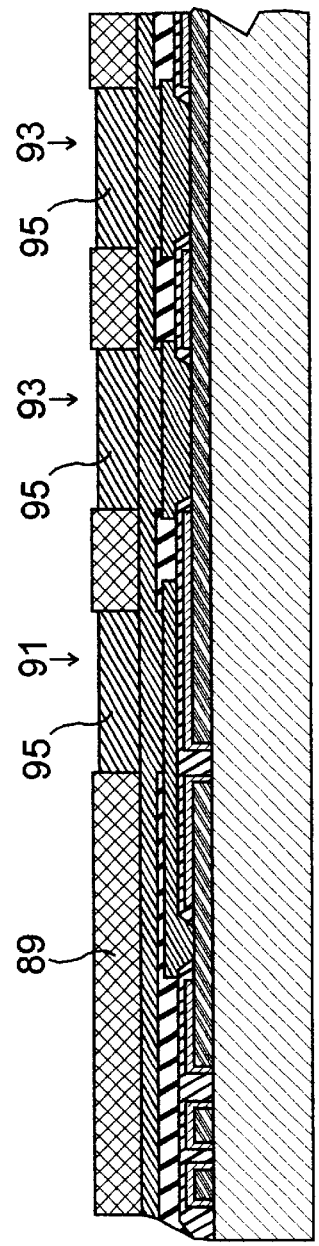
Figure 17:
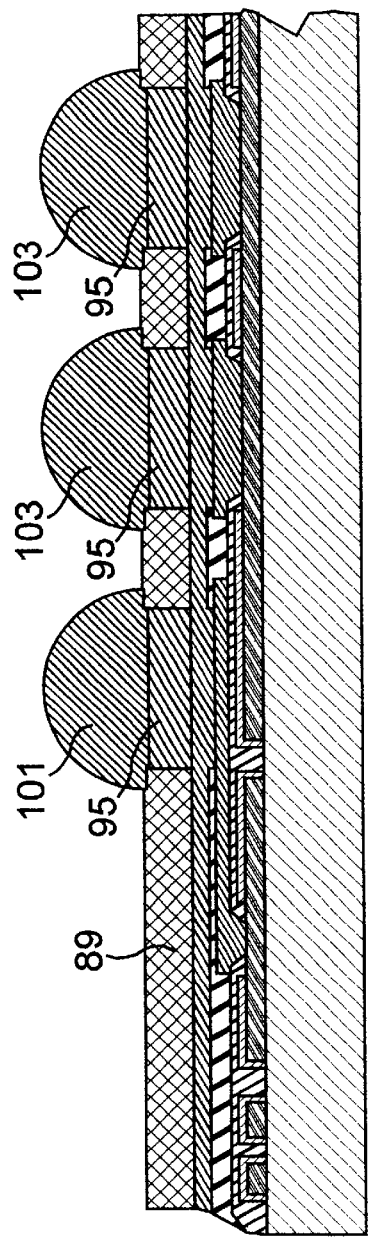
Figure 18:
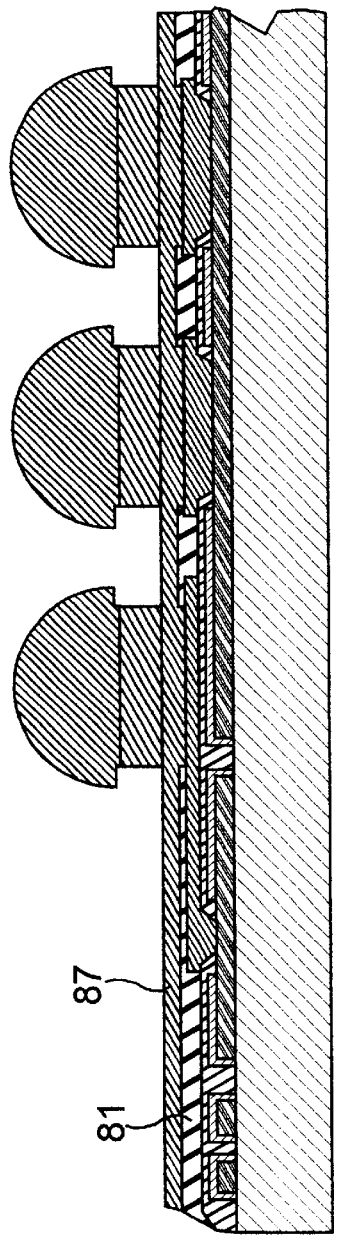
Figure 19:
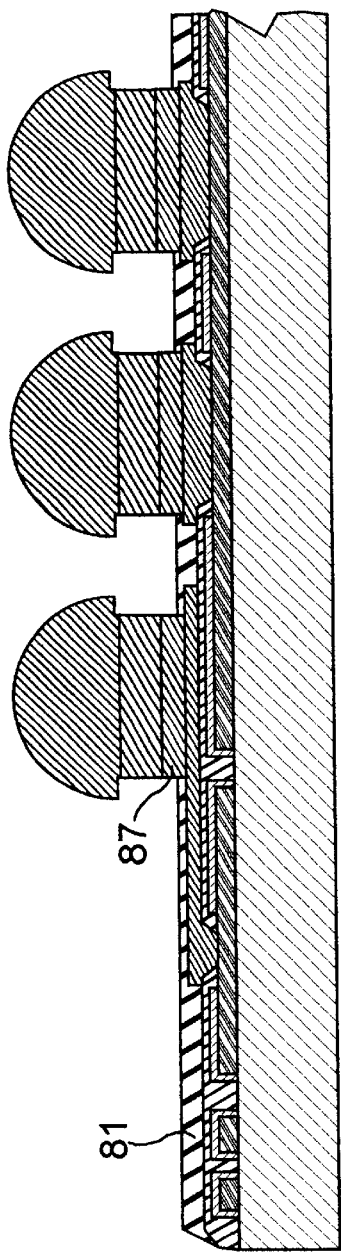
Figure 20:
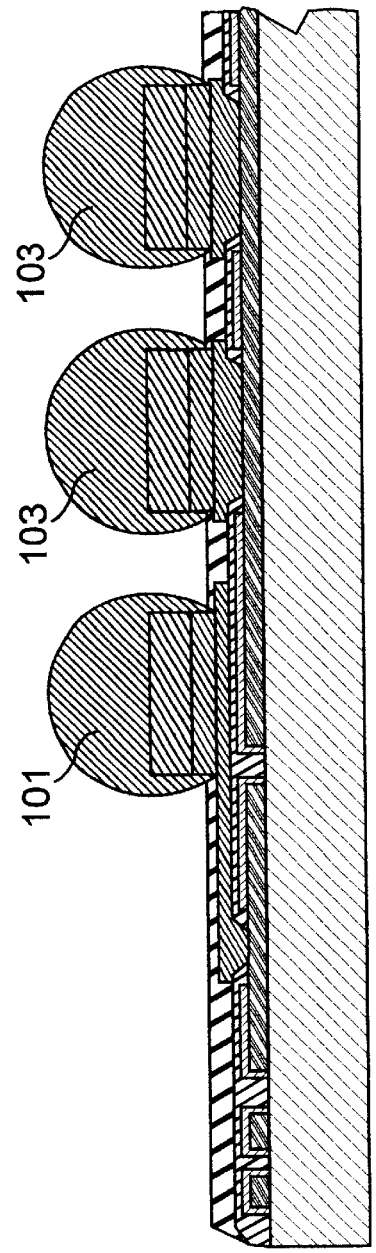
Figure 21:
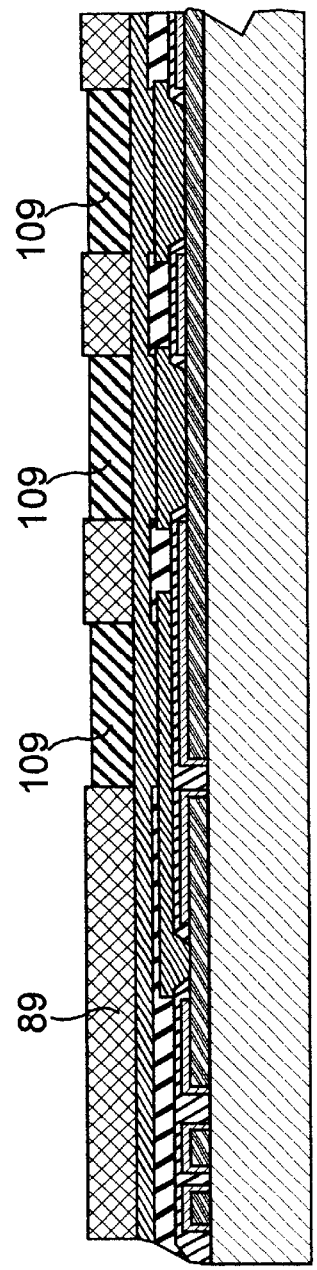
FIGS. 21 through 23 show alternate steps in the fabrication of multiple gate contacts using non-copper metal platings instead of solder bumps.
Figure 22:
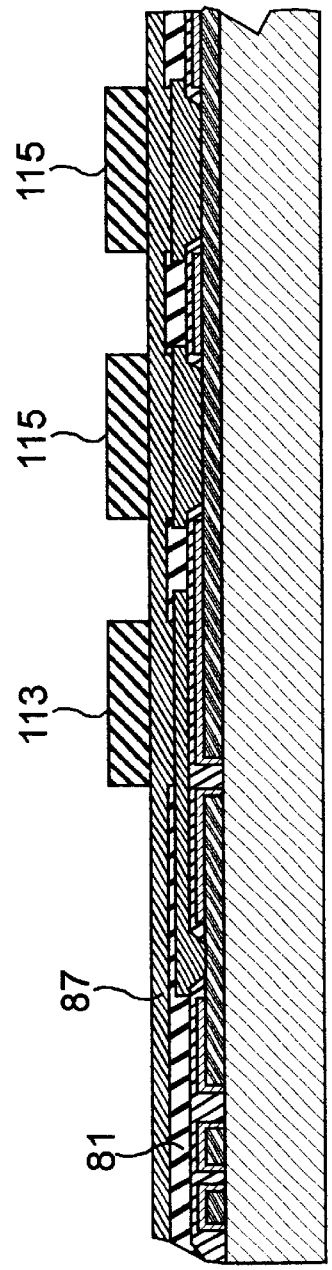

The fabrication of multiple gate contacts according to the invention proceeds as follows. See FIG. 3. A semiconductor wafer 50, typically silicon or other suitable semiconductor material, has gate and source metallizations 52 and 54 (typically aluminum or other suitable contact metal) respectively, silicon oxide or silicon nitride passivations 53 and 55 respectively, and contact passivation openings 56 and 58 respectively already in place. The wafer is cleaned. A first BCB layer 61 is coated and baked on the wafer as shown (FIG. 4). The BCB is exposed to define the exposed gate contact 63 and source contacts 65, and then developed (FIG. 5) to expose contacts 63 and 65. Titanium, copper, NICHROME, or TiCu 67 is then sputtered onto gate contact 63 and source contacts 65 for overall metallization (FIG. 6). A first photoresist coating 69 is added (FIG. 7), UV-exposed and developed to protect the areas 68 where TiCu is to be retained (FIG. 8). The unprotected Cu and Ti are etched in areas 71 (FIG. 9), creating each lateral pathway 73 between the gate contact 63 and each eventual gate bump termination 75 (FIG. 10), and the photoresist is stripped off. A second BCB layer 81 is coated, baked, exposed and developed (FIGS. 11 and 12) on the wafer to define each gate bump termination, or pad opening, 85, and each source bump termination, or pad opening, 86. Cu is sputtered onto the wafer surface to provide a conductive layer 87 (FIG. 13). A second photoresist coating 89 is added onto the sputtered Cu (FIG. 14), and is UV-exposed and developed (FIG. 15) to expose the gate bump areas 91 and the source bump areas 93 of Cu where gate solder bumps and source solder bumps respectively will eventually be placed. Cu 95 is plated onto the exposed Cu areas 91 and 93 (FIG. 16) to ensure retention of bulk copper interconnect material after soldering process; part of it is consumed with the formation of Cu-Sn intermetallics. Gate solder bumps 101 and source solder bumps 103 are plated onto Copper or nickel [Cu] 95 (FIG. 17), with photoresist 89 supporting the edges of the bumps around each Cu area. The photoresist 89 is stripped (FIG. 18), exposing sputtered Cu layer 87, and sputtered Cu layer 87 is etched (FIG. 19) to define the conductive areas and expose the second BCB layer 81. The plated solder is reflowed (FIG. 20) to form the final gate solder bumps 101 and source solder bumps 103. A drain contact (not shown) is formed on the lower second surface of the wafer in a manner well-known in the art. The drain contact is suitably implanted with dopants of the same polarity used to form source regions and the drain contact is covered with a metal layer, typically aluminum.

In an alternate embodiment, the invention's process does not require the use of solder bumps. Instead of the Cu plating 95 of FIG. 16, another metal such as Ni 109 is plated (FIG. 21) in place of the UBM. The photoresist is stripped (FIG. 22), exposing the sputtered Cu layer 87, and the sputtered Cu is etched (FIG. 23) to define the conductive areas for each gate pad 113 and each source pad 115 and expose the second BCB layer 87. In this alternate embodiment, connections are made directly to the plated metal.

Figure 24:
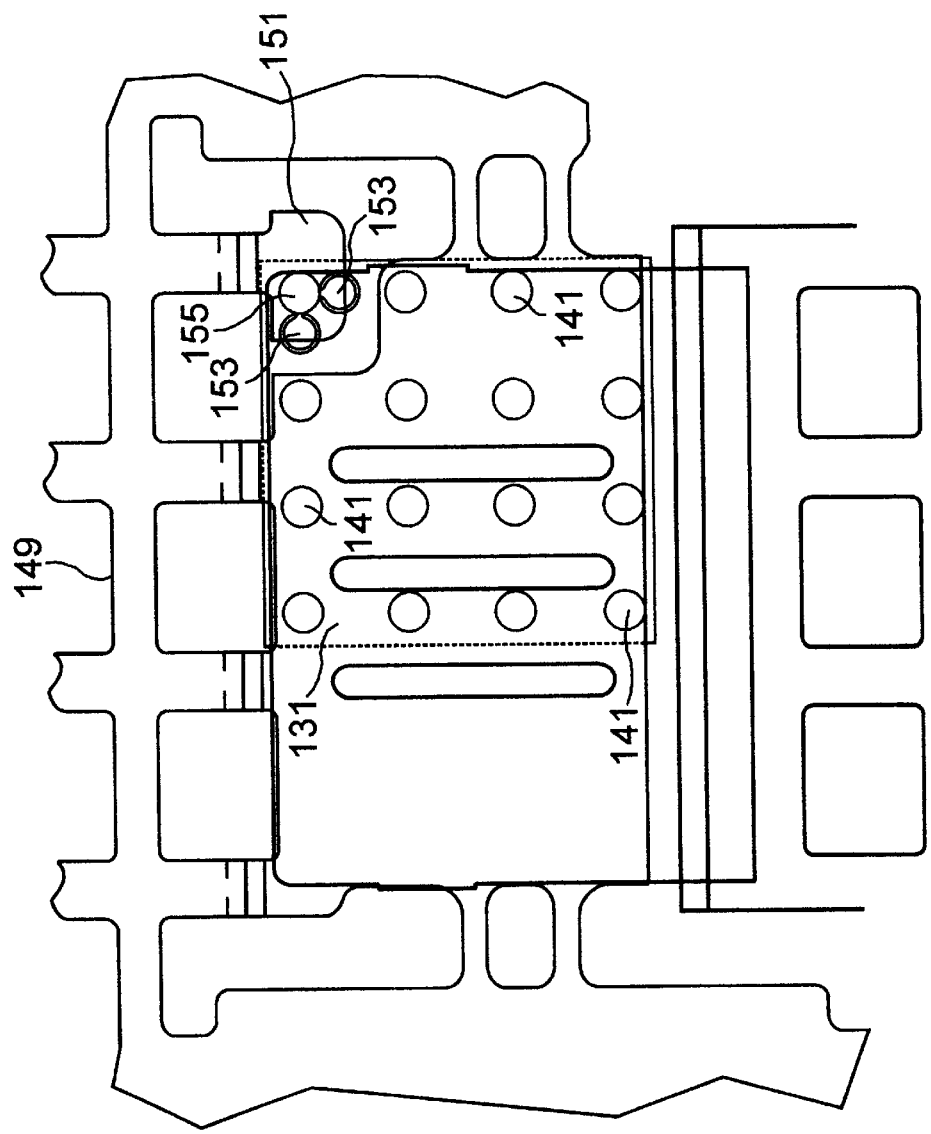
FIG. 24 illustrates the invention's dual gate bump on the gate lead of the leadframe. The invention does not require any change on the leadframe design or assembly process with respect to existing designs and processes.
Figure 24A:
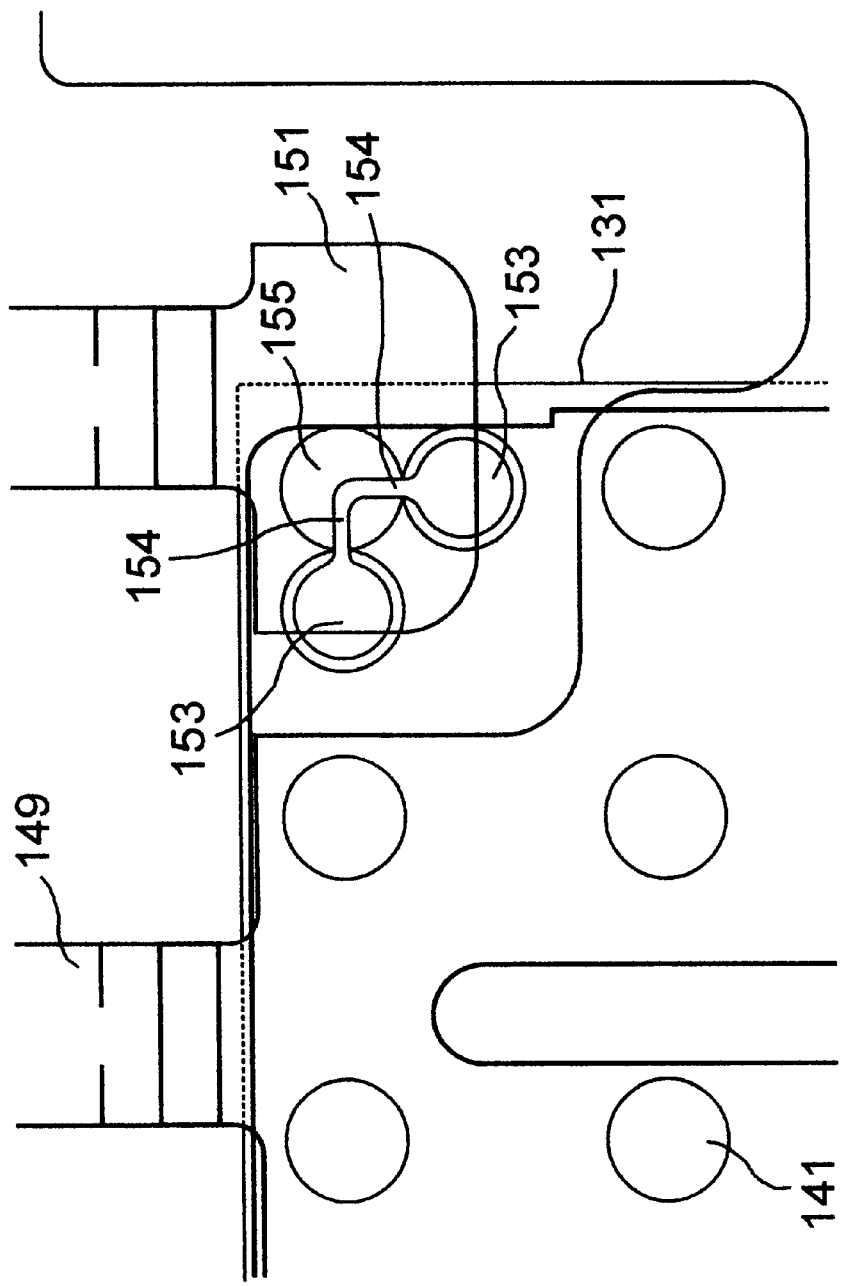
FIG. 24a is a close-up view of the dual gate pad layout with the gate lead layout of the leadframe.

The invention's repositioning and replication of the gate pads is done so as to have no effect on leadframe design or the assembly process. See FIG. 24, showing a die 131 with source bumps 141 and gate bumps 153, and leadframe 149 in working position superimposed on die 131 and having gate lead 151. FIG. 24a shows an enlargement of the gate bump area. Gate lead 151 of leadframe 149 contacts gate bumps 153 as shown, with UBM extensions 154 from gate contact area 155. The contour of leadframe 149 is exactly the same as it would be for use with a single gate bump situated directly over gate contact area 155.

Figure 24B:
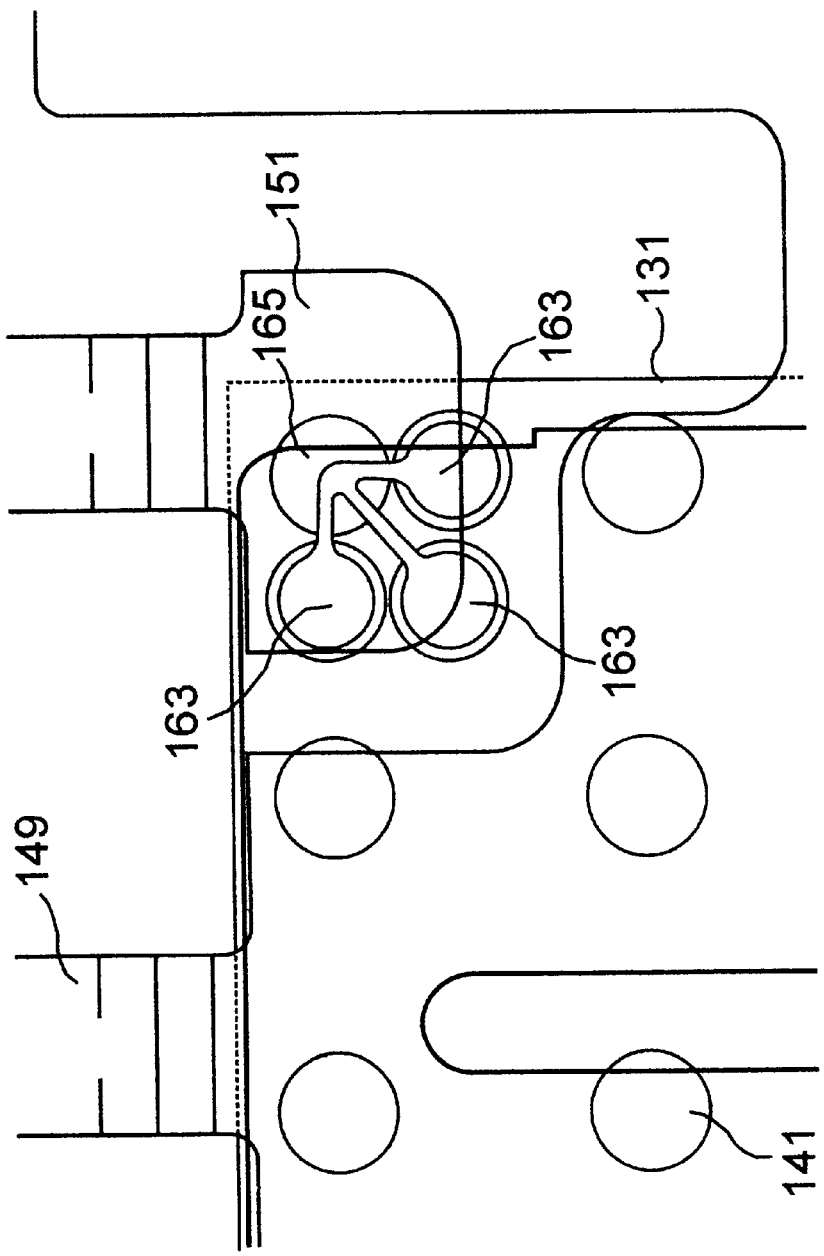
FIG. 24b shows a triple gate pad layout in another embodiment of the invention. The die position in this embodiment requires movement on the x-axis, as shown, but no changes are required on the leadframe design and assembly process.

In still another embodiment.shown in FIG. 24b, the invention provides for three gate bumps 163 connected with gate contact area 165 as in the two-gate-bump embodiment. The three-gate-bump embodiment of FIG. 24b requires a repositioning of die 131 horizontally, which can be seen by comparing FIGS. 24b and 24a, but there is still no change in leadframe design or assembly process. The provision of three gate bumps improves the reliability of connection.

Conclusion, Ramifications, and Scope of Invention

From the above descriptions, figures and narratives, the invention=s advantages in providing reliable, durable, and economical MOSFET gate contacts without affecting leadframe design or die assembly should be clear.

Although the description, operation and illustrative material above contain many specificities, these specificities should not be construed as limiting the scope of the invention but as merely providing illustrations and examples of some of the preferred embodiments of this invention.

Thus the scope of the invention should be determined by the appended claims and their legal equivalents, rather than by the examples given above.

What is claimed:

1. A semiconductor device having a robust and reliable MOSFET gate external connection, comprising:

a semiconductor body having a first surface and a second surface; a source contact area on the first surface of the semiconductor body;

a drain contact area on the second surface of the semiconductor body;

a gate contact area on the first surface of the semiconductor body and separate from the source contact area;

a source contact metallization layer overlying the source contact area; a gate contact metallization layer overlying the gate contact area;

a source contact passivation layer overlying the source contact metallization layer and having one or more openings exposing a portion of the surface of the source contact metallization layer;

a gate contact passivation layer overlying the gate contact metallization layer and having one or more openings exposing a portion of the surface of the gate contact metallization layer;

a first insulating layer overlying the gate contact passivation layer and the source contact passivation layer and having one or more openings exposing a portion of the surface of the gate contact metallization layer;

a first conducting metal layer overlying the first insulating layer, connected to the gate contact metallization layer via the one or more openings in the first insulating layer, not overlying exposed areas of the source metallization layer, and partially overlying unexposed areas of the source contact metallization layer;

a second insulating layer overlying the first conducting metal layer and the first insulating layer and having two or more openings each overlying the source contact metallization layer wherein each such opening exposes a portion of the surface of the first conducting metal layer;

a second conducting metal layer having two or more zones each overlying and in contact with one exposed portion of the first conducting metal layer, and each having an outline of size and shape substantially the same as the exposed portion of the outline of the first conducting metal layer;

a metal plating layer having two or more zones each overlying and in contact with one exposed portion of the second conducting metal layer overlying an exposed portion of the first conducting metal layer, and each having an outline of size and shape substantially the same as the exposed portion of the outline of the first conducting metal layer; and two or more solder bumps each overlying one metal plating layer zone, and each having an outline of size and shape substantially the same as the exposed portion of the outline of the metal plating layer.

2. The device of claim 1 wherein the semiconductor body comprises a silicon wafer.

3. The device of claim 1 wherein the source contact metallization layer comprises aluminum.

4. The device of claim 1 wherein the gate contact metallization layer comprises aluminum.

5. The device of claim 1 wherein the source contact passivation layer comprises silicon dioxide.

6. The device of claim 1 wherein the source contact passivation layer comprises silicon nitride.

7. The device of claim 1 wherein the gate contact passivation layer comprises silicon dioxide.

8. The device of claim 1 wherein the gate contact passivation layer comprises silicon nitride.

9. The device of claim 1 wherein the first insulating layer comprises benzocyclobutene.

10. The device of claim 1 wherein the first conducting metal layer comprises titanium.

11. The device of claim 1 wherein the first conducting metal layer comprises copper.

12. The device of claim 1 wherein the second insulating layer comprises benzocyclobutene.

13. The device of claim 1 wherein the second conducting metal layer comprises copper.

14. The device of claim 1 wherein the metal plating layer comprises copper.

15. The device of claim 1 wherein the metal plating layer comprises nickel.

16. A semiconductor device having a robust and reliable MOSFET gate external connection, comprising:

a semiconductor body having a first surface and a second surface;

a source contact area on the first surface of the semiconductor body; a drain contact area on the second surface of the semiconductor body;

a gate contact area on the first surface of the semiconductor body and separate from the source contact area;

a source contact conducting extension means overlying the source contact area;

a gate contact conducting extension means overlying the gate contact area;

a source contact protection means overlying the source contact conducting extension means and having one or more openings exposing a portion of the surface of the source contact conducting extension means;

a gate contact protection means overlying the gate contact conducting extension means and having one or more openings exposing a portion of the surface of the gate contact conducting extension means;

a first insulating layer overlying the gate contact protection means and the source contact protection means and having one or more openings exposing a portion of the surface of the gate contact conducting extension means;

a first conducting means overlying the first insulating layer, connected to the gate contact conducting extension means via the one or more openings in the first insulating layer, not overlying exposed areas of the source conducting extension means, and partially overlying unexposed areas of the source contact conducting extension means;

a second insulating layer overlying the first conducting means and the first insulating layer and having two or more openings each overlying the source contact conducting extension means wherein each such opening exposes a portion of the surface of the first conducting means;

a second conducting means having two or more zones each overlying and in contact with one exposed portion of the first conducting means, and each having an outline of size and shape substantially the same as the exposed portion of the outline of the first conducting means; and a conducting external connection means having two or more zones each overlying and in contact with one exposed portion of the second conducting means overlying an exposed portion of the first conducting means, and each having an outline of size and shape substantially the same as the exposed portion of the outline of the first conducting means.

17. The device of claim 16, wherein the semiconductor body comprises a silicon wafer.

18. The device of claim 16 wherein the source contact conducting extension means comprises a metallization layer.

19. The device of claim 18 wherein the metallization layer comprises aluminum.

20. The device of claim 16 wherein the gate contact conducting extension means comprises a metallization layer.

21. The device of claim 20 wherein the metallization layer comprises aluminum.

22. The device of claim 16 wherein the source contact protection means comprises a passivation layer.

23. The device of claim 22 wherein the passivation layer comprises silicon dioxide.

24. The device of claim 22 wherein the passivation layer comprise silicon nitride.

25. The device of claim 16 wherein the gate contact protection means comprise a passivation layer.

26. The device of claim 25 wherein the passivation layer comprises silicon dioxide.

27. The device of claim 25 wherein the passivation layer comprises silicon nitride.

28. The device of claim 16 wherein the first insulating layer comprises benzocyclobutene.

29. The device of claim 16 wherein the first conducting means comprises a conducting metal layer.

30. The device of claim 29 wherein the conducting metal layer comprises copper, titanium and NICHROME.

31. The device of claim 16 wherein the second insulating layer comprises benzocyclobutene.

32. The device of claim 16 wherein the second conducting means comprises a conducting metal layer.

33. The device of claim 32 wherein the conducting metal layer comprises copper.

34. The device of claim 16 wherein the conducting external connection means comprises a metal plating layer.

35. The device of claim 34 wherein the metal plating layer comprises copper.

36. The device of claim 34 wherein the metal plating layer comprises nickel.

37. A semiconductor device having a robust and reliable MOSFET gate external connection, comprising:
- a semiconductor body having a first surface and a second surface;
- a source contact area on the first surface of the semiconductor body;
- a drain contact area on the second surface of the semiconductor body;
- a gate contact area on the first surface of the semiconductor body and separate from the source contact area;
- a source contact metallization layer overlying the source contact area;
- a gate contact metallization layer overlying the gate contact area;
- a source contact passivation layer overlying the source contact metallization layer and having one or more openings exposing a portion of the surface of the source contact metallization layer;
- a gate contact passivation layer overlying the gate contact metallization layer and having one or more openings exposing a portion of the surface of the gate contact metallization layer;
- a first insulating layer overlying the gate contact passivation layer and the source contact passivation layer and having one or more openings exposing a portion of the surface of the gate contact metallization layer;
- a first conducting metal layer overlying the first insulating layer, connected to the gate contact metallization layer via the one or more openings in the first insulating layer;
- a second insulating layer overlying the first conducting metal layer and the first insulating layer and having two or more openings each overlying the source contact metallization layer wherein each such opening exposes a portion of the surface of the first conducting metal layer; and
- two or more solder bumps each over the second insulating layer and coupled to the first conducting metal layer.

38. The device of claim 37 further comprising
- a second conducting metal layer having two or more zones each overlying and in contact with one of the exposed portions of the first conducting metal layer;
- a metal plating layer having two or more zones each overlying and in contact with one exposed portion of the second conducting metal layer overlying an exposed portion of the first conducting metal layer for coupling the solder bumps to the first conducting metal layer.

39. A semiconductor device having a robust and reliable MOSFET gate external connection, comprising:
- a semiconductor body having a first surface and a second surface;
- a source contact area on the first surface of the semiconductor body;
- a drain contact area on the second surface of the semiconductor body;
- a gate contact area on the first surface of the semiconductor body and separate from the source contact area;
- a source contact metallization layer overlying the source contact area;
- a gate contact metallization layer overlying the gate contact area;
- a source contact passivation layer overlying the source contact metallization layer and having one or more openings exposing a portion of the surface of the source contact metallization layer;
- a gate contact passivation layer overlying the gate contact metallization layer and having one or more openings exposing a portion of the surface of the gate contact metallization layer;
- a first insulating layer overlying the gate contact passivation layer and the source contact passivation layer and having one or more openings exposing a portion of the surface of the gate contact metallization layer;
- a first conducting metal layer overlying the first insulating layer, connected to the gate contact metallization layer via the one or more openings in the first insulating layer;
- a second insulating layer overlying the first conducting metal layer and the first insulating layer and having two or more openings each overlying the source contact metallization layer wherein each such opening exposes a portion of the surface of the first conducting metal layer;
- a second conducting metal layer having two or more zones each overlying and in contact with one of the exposed portions of the first conducting metal layer;
- a metal plating layer having two or more zones each overlying and in contact with one exposed portion of the second conducting metal layer overlying an exposed portion of the first conducting metal layer; and
- a conducting external connection means having two or more zones each overlying and coupled to the first conducting layer.

40. The device of claim 39 further comprising
- a second conducting metal layer having two or more zones each overlying and in contact with one of the exposed portions of the first conducting metal layer;
- a metal plating layer having two or more zones each overlying and in contact with one exposed portion of the second conducting metal layer overlying an exposed portion of the first conducting metal layer for coupling the external connection means to the first conductive layer.

* * * * *